United States Patent [19]

Scarpa et al.

[11] Patent Number: 5,673,293

[45] Date of Patent: Sep. 30, 1997

[54] METHOD AND APPARATUS FOR DEMODULATING QAM AND VSB SIGNALS

[75] Inventors: Carl G. Scarpa, Edison; Joshua L. Koslov, Hopewell; Frank A. Lane, Medford Lakes, all of N.J.

[73] Assignee: Hitachi America, Ltd., Tarrytown, N.Y.

[21] Appl. No.: 303,307

[22] Filed: Sep. 8, 1994

[51] Int. Cl.$^6$ ............................................. H03C 1/52
[52] U.S. Cl. ............................ 375/321; 375/323; 455/204
[58] Field of Search .................................. 375/216, 321, 375/344, 261, 268, 281, 270; 455/142, 204, 214; 329/357, 304, 315

[56] References Cited

U.S. PATENT DOCUMENTS

| | | | |
|---|---|---|---|
| 3,851,252 | 11/1974 | Karnaugh et al. | 375/353 |
| 4,972,357 | 11/1990 | Morel | 364/724.1 |
| 5,067,140 | 11/1991 | Weinert | 375/321 |
| 5,410,368 | 4/1995 | Krishnamurthy et al. | 348/726 |
| 5,418,815 | 5/1995 | Ishikawa et al. | 375/216 |
| 5,479,449 | 12/1995 | Patel et al. | 375/321 |
| 5,506,636 | 4/1996 | Patel et al. | 375/261 X |

Primary Examiner—Stephen Chin
Assistant Examiner—Kevin Kim
Attorney, Agent, or Firm—Michaelson & Wallace; Michael P. Straub; Peter L. Michaelson

[57] ABSTRACT

Method and apparatus for providing a QAM, a VSB, and a joint QAM/VSB demodulator are described. The describe demodulators are designed to minimize the amount of duplicated circuitry required to implement a joint QAM/VSB demodulator capable of performing the functions of the disclosed individual QAM and VSB demodulators. All digital architectures are used for each of the described demodulators to facilitate their combination into the described joint VSB/QAM demodulator. The described demodulators are suitable for demodulating, e.g. advanced or high definition television signals modulated using QAM or VSB modulation techniques.

22 Claims, 9 Drawing Sheets

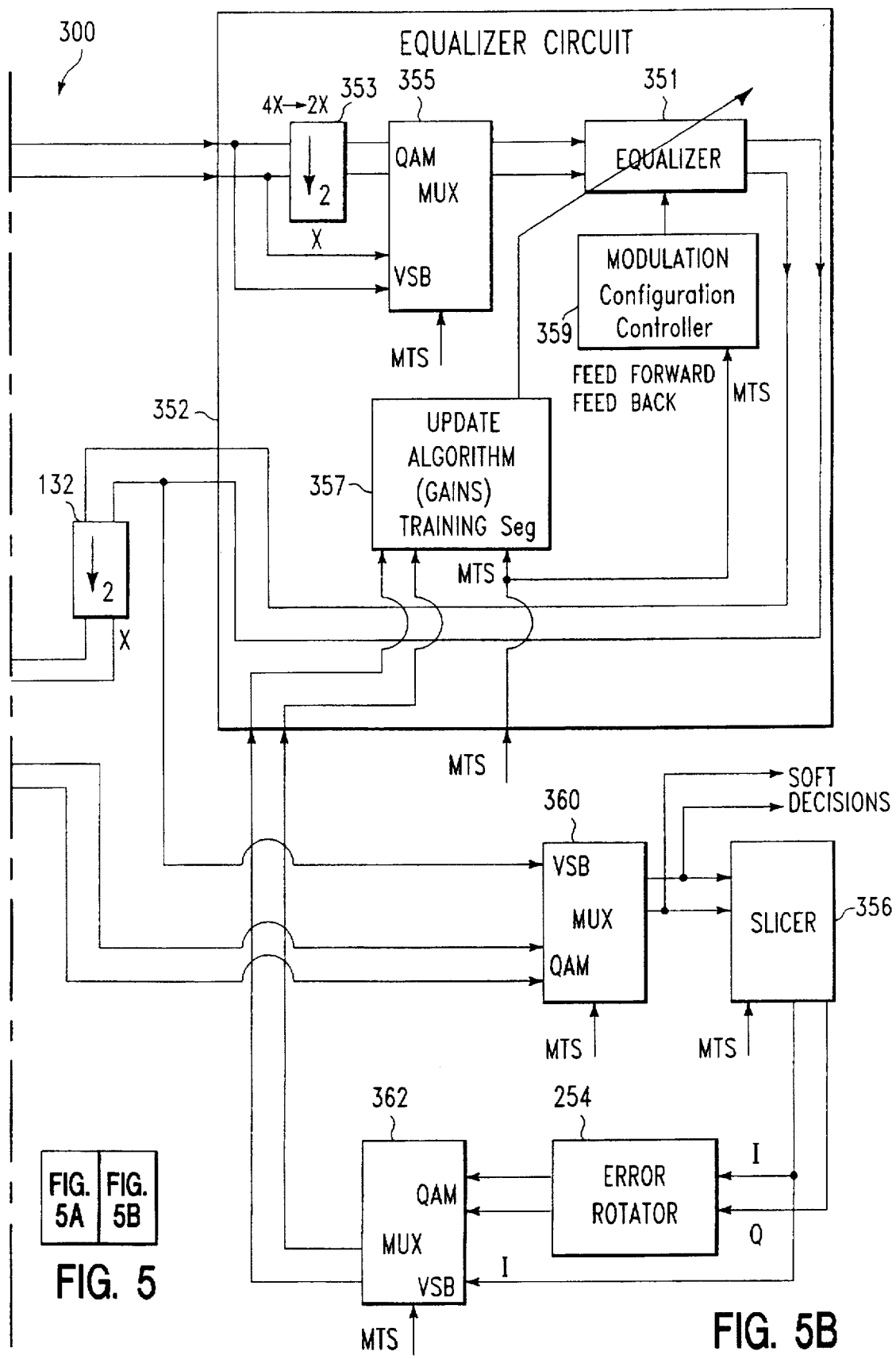

METHOD AND APPARATUS FOR DEMODULATING QAM AND VSB SIGNALS

FIELD OF THE INVENTION

The present invention is directed to methods and apparatus for demodulating QAM and VSB signals and, more particularly, to an implementation efficient method and apparatus for demodulating either QAM or VSB signals.

BACKGROUND OF THE INVENTION

The use of quadrature amplitude modulation and vestigial sideband modulation for transmitting data, such as television signals, is growing in popularity.

Advanced television ("ATV") systems in the United States, e.g., high definition television ("HDTV") systems, appear to be headed in two different directions with regard to the type of modulation used to transmit television signals.

At present, cable companies in the United States are preparing to transmit ATV digital signals over cable using a Quadrature Amplitude Modulation ("QAM") technique of data transmission.

On the other hand, the terrestrial television industry in the U.S. is planning to broadcast digital ATV signals using a 8 level Vestigial SideBand ("8VSB") technique of data transmission proposed by Zenith corporation/Grand Alliance.

Accordingly, to be capable of receiving and displaying both cable and terrestrial ATV television transmissions, a television receiver will have to be capable of receiving and demodulating both QAM and 8VSB ATV signals.

While one approach to providing such a capability would be to incorporate two separate demodulation circuits into a receiver, e.g., one to demodulate QAM signals and the other to demodulate VSB signals, such an approach has the drawback of the increased cost of having to provide two demodulators as opposed to a single demodulator. With the duplication of demodulators in this manner, the cost of the demodulator section of a television receiver may be double the cost of receivers incorporating a single demodulator.

In the consumer television market, where cost tends to be an important factor in determining a product's success, the cost associated with providing two separate demodulators, makes such an approach an unattractive solution to the problem of having to provide the ability to demodulate both QAM and VSB ATV signals.

Accordingly, because of the increasing use of both QAM and VSB modulation for transmitting data there is a need for a demodulator circuit capable of demodulating both types of signals.

In particular, there is a need for a method and apparatus that can provide television receivers with the ability to demodulate both QAM and VSB signals without incurring the cost associated with providing two separate demodulators to provide the required demodulation capability.

Furthermore, it is highly desirable, that the demodulation circuits used in a receiver for both VSB and QAM signal demodulation be capable of operating with the same tuner and surface acoustic wave ("SAW") filter circuitry to avoid the need to provide separate tuner/SAW filter circuity to support demodulation of QAM and VSB signals.

SUMMARY OF THE PRESENT INVENTION

The present invention is directed to methods and apparatus for providing a QAM, a VSB, and a joint QAM/VSB demodulator.

Digital QAM and VSB demodulators in accordance with the present invention are disclosed. The QAM and VSB demodulators are designed so that they can be readily combined to form a single joint QAM/VSB demodulator with a minimal amount of extra circuitry being required beyond that needed to independently implement either the QAM or VSB demodulators.

Digital architectures are used for each of the described demodulators of the present invention to facilitate their combination into the described joint QAM/VSB demodulator. In the described embodiments, minimal requirements for channel selectivity are placed on the tuner so that the same tuner circuitry can be used for demodulation of both QAM and VSB signals. e.g, QAM and VSB ATV signals.

In addition to using a single tuner module for both QAM and VSB operation, to achieve an implementation efficient joint QAM/VSB demodulator, the demodulator of the present invention uses multiplexed signal paths to reconfigure the demodulator circuitry as required for either QAM or VSB demodulation. In addition, digital filters having structures that are suitable for use during both QAM and VSB modes of operation are used, with a relatively simple change in filter tap weights being made to switch the filters' configurations to make then suitable for use in either of the modes of operation, i.e., QAM or VSB mode.

As a result of the above described design features the joint QAM/VSB demodulator of the present invention has the advantage of a low requirement for additional hardware over a single QAM or VSB demodulator, perhaps in the order of ten percent.

Thus, the joint QAM/VSB demodulator of the present invention offers a cost effective alternative to providing two independent demodulators to provide the capability needed to demodulate both QAM and VSB signals.

Numerous other features of the demodulation methods and apparatus of the present, in addition to those described above, are set forth in the detailed description that follows.

DETAILED DESCRIPTION

The present invention is directed to methods and apparatus for demodulating QAM and VSB signals and, more particularly, to an implementation efficient method and apparatus for demodulating either QAM or VSB signals.

Figure 1:
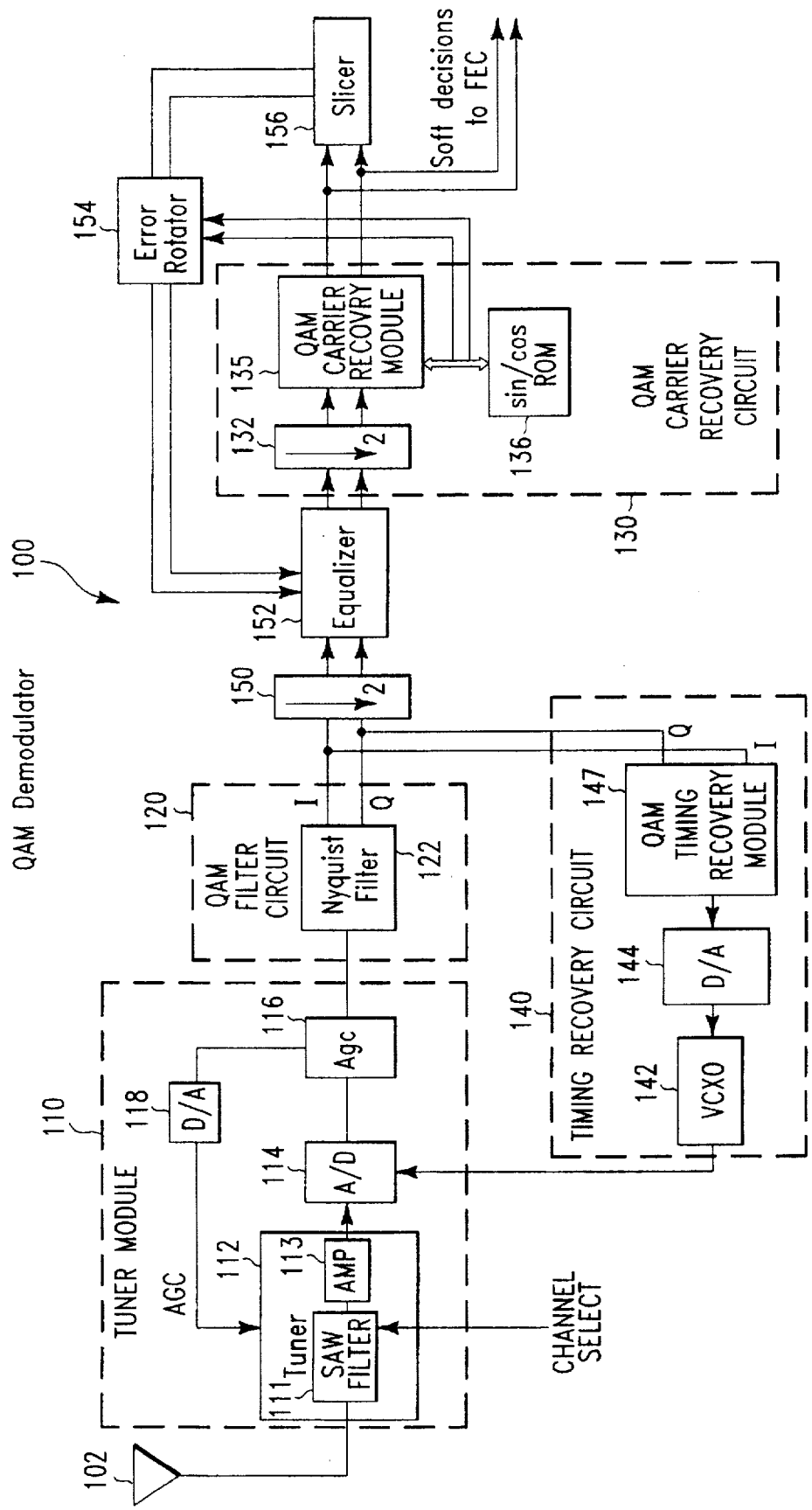
FIG. 1 is a schematic block diagram of a QAM demodulation circuit in accordance with one embodiment of the present invention.

Referring now to FIG. 1, there is illustrated a QAM demodulator circuit generally indicated by the reference numeral 100, implemented in accordance with one embodiment of the present invention.

As illustrated, the QAM demodulator 100 comprises a tuner module 110, a QAM filter circuit 120, a decimation circuit 150, an equalizer 152, a QAM carrier recovery circuit 130, an error rotator 154, a slicer 156 and a timing recovery circuit 140.

The QAM demodulator 100 receives a television signal, e.g., an ATV signal, via an antenna 102 which has an output coupled to the input of the tuner module 110. Alternatively, the tuner module 110 may receive the television signal via a cable television service or other service provider.

The tuner module 110, which is designed to work with a QAM signal, may also be used with a VSB signal as will be discussed below. The tuner module 110 comprises a tuner circuit 112, an analog to digital ("A/D") converter 114, an automatic gain control ("AGC") circuit 116 and a digital to analog ("D/A") converter 118. The tuner circuit 112 includes a SAW filter 111, used for channel selectivity, coupled to a gain controllable amplifier 113 used to control the gain of the signal output by the tuner 112.

A television signal input of the tuner 112 is coupled to the output of the antenna 102 to receive therefrom an analog television signal. The QAM demodulator illustrated in FIG. 1 makes no demand on the shape of the SAW filter 111 except that it provide channel selectivity and sufficient adjacent channel rejection. Significantly, there is no need for the SAW filter 111 to have apriori knowledge of the signal of interest. In one embodiment, the SAW filter 111 is designed to act as a matched, e.g., Nyquist, filter having a generally flat passband and a relatively sharp rolloff. Such Matched/Nyquist filtering is performed in the digital domain. In one particular embodiment, the SAW filter 111 is designed as a passband filter having a gain of approximately 0 dB in the passband and a gain of between −40 to −60 dB in the rejection or stop band where the transition band between the passband and stop band is approximately ½ MHz in width.

The output of the SAW filter 111 and thus the timer circuit 112, is selected to place the QAM signal at a center frequency that is convenient for sampling. To allow for simplified filter designs, the center frequency of the SAW filter 111 is chosen, in one embodiment, to be equal to the symbol rate of the received QAM television signal. For example, in the illustrated embodiment, the SAW filter 111 has a center frequency corresponding to the QAM symbol rate, e.g., 5 MHz, and a bandwidth of, e.g., 6 MHz, the bandwidth expected to be used for QAM ATV signals. However, if desired, it is possible to have the tuner 112, including the SAW filter 111, operate at a higher more traditional sampling rate, e.g., 44 MHz, with subsampling being used later to drop down the output rate of the tuner to the QAM symbol rate.

Thus, the tuner 112, including the SAW filter 111, receives the analog television signal output by the antenna 102 and performs bandpass filtering to pass the television signal corresponding to a channel selected, e.g., by a user, via a channel select signal input of the tuner 112.

The analog television signal output by the tuner 112 is supplied to a television signal input of the A/D converter 114. The A/D converter 114 samples the analog television signal, using e.g., 8 bits of precision, at a rate determined by a sampling rate control signal supplied to a sampling rate control input of the A/D converter 112, e.g., at a rate four times the symbol rate. Thus, in the illustrated embodiment, the sampling rate of the A/D converter 114 is controlled to be 4× the QAM symbol rate, e.g., 20 MHz in the case of a 5 MHz QAM symbol rate. By sampling the analog television signal in this manner, the A/D converter digitizes the analog signal into e.g., a series of 8 or 9 bit digital samples.

To insure that the A/D converter's dynamic range is properly used, the AGC gain control circuit 116 is used in cooperation with the D/A converter 118 to supply an automatic gain control signal back to the tuner 112. The AGC signal is derived by the AGC control circuit 116 in the digital domain, is converted into an analog signal by the D/A converter 118 and then supplied to the gain controllable amplifier 113 of the tuner circuit 112. In this manner, the AGC signal and the gain controllable amplifier 113 are used to control the gain of the tuner circuit 112 to insure that the tuner circuit's output remains in the dynamic range of the A/D converter 114.

The AGC signal can be derived by any one of numerous known techniques. However, if the AGC circuit is to be used as part of a joint QAM/VSB demodulator circuit, it is best to be derived in such a manner that it is not modulation dependent. In one embodiment, a non-modulation dependent technique, referred to as blind gain control, is used by the AGC circuit 116 to generate the AGC signal. In accordance with this technique, the AGC signal is generated by measuring the total power in the received television signal and then comparing the total power to a reference power level. The difference between the measured power level and the reference power level is then used to generate the AGC control signal.

The output of the of the A/D converter is coupled to the input of the AGC circuit 116 to thereby provide the AGC circuit with the digital television signal.

The AGC circuit 116 has a digital television signal output which is coupled to the input of the QAM filter circuit 120. The AGC circuit outputs the digital television signal having a rate of 4× the QAM symbol rate and an amplitude controlled by the AGC circuit 116.

As illustrated in FIG. 1, the QAM filter circuit 120 includes a Nyquist filter 122, i.e., a matched complex passband filter that is used for pulse shaping the digital television signal output by the tuner module 110.

Nyquist filters are used in most QAM modulation techniques for limiting signal bandwidth at the transmitter and matched filtering at the receiver. Nyquist filtering is most commonly split equally between the transmitter and receiver to achieve these goals. In the QAM demodulator circuit 100 illustrated in FIG. 1, this filtering is done at passband (rather than baseband) with complex filtering.

The Nyquist filter 122 receives the digital television signal which is a real input signal from the tuner module 110. The real input signal received by the Nyquist filter 122 is applied to the inputs of two filters that comprise the complex Nyquist filter 122. The filters that comprise the Nyquist filter 122 have fixed weight coefficients and can be designed using Canonical Signed Digits ("CSD") to reduce hardware complexity. Every other tap of the Passband Nyquist filters centered at the symbol rate is zero as a result of the baseband weights being translated up to the symbol rate by sin and cosine waveforms at one-fourth of the sampling rate.

The outputs of the filters that comprise the Nyquist filter 122, are unequalized in-phase ("I") and quadrature-phase ("Q") filtered television signals, respectively.

In the illustrated embodiment, the Nyquist filter 122 operates at four times the symbol rate, i.e., it operates at the sampling rate of the A/D converter 114. The I and Q signal outputs of the Nyquist filter 122 are coupled to corresponding I and Q inputs of the decimation circuit 150 and the timing recovery circuit 147.

The decimation circuit 150 decimates the I and Q television signals output by the QAM filter circuit 120 to remove half of the symbols in the signals, i.e., to reduce the symbol rate from 4 times the symbol rate of the QAM television signal being received to 2 times the symbol rate of the QAM television signal. Decimation by a factor of two is allowed because the complex Nyquist filters form an analytic signal.

While a down-sampled rate of one-half the original sampling rate is applied to the inputs of the equalizer 152, the full sampling rate I and Q signals output by the Nyquist filter 122 are applied to the inputs of the timing recovery circuit 147.

The symbol timing recovery circuit 140 comprises a QAM symbol timing recovery module 147 having I and Q inputs coupled to the corresponding outputs of the Nyquist filter 122 and an output coupled to a D/A converter 144. The D/A converter 144, in turn, has an output coupled to a voltage controlled crystal oscillator ("VCXO") 142 which is responsible for generating the sampling rate control signal supplied to the control input of the tuner module's A/D converter 114.

Thus, the QAM timing recovery module 147 receives as its input signal the full rate I and Q television signals output by the QAM filter circuit's Nyquist filter 122. A plurality of known techniques can be used to implement the QAM timing recovery module 147 and to thereby provide the required QAM symbol timing recovery. For a discussion of various techniques and circuits suitable for implementing the QAM timing recovery module 147, see Digital Communication, by Edward A. Lee and David G. Messerschmit (1988), hereby expressly incorporated by reference.

Because of the differences between QAM and VSB modulation techniques it is unlikely that a single timing recovery module 147 will be able to be used for both QAM and VSB timing recovery. However, it is possible to design QAM and VSB timing recovery modules so that some components of the modules can be shared in common. For example, when implementing a joint QAM/VSB demodulator circuit it may be possible to commonly use some phase lock loop ("PLL") accumulators, multipliers, adders, etc. that comprise each of a QAM and a VSB timing recovery module.

The QAM timing recovery module 147 generates a digital timing control signal, e.g., an 8 bit signal, which is converted into an analog signal by the D/A converter 144. The analog signal is then supplied to the VCXO 142 which is responsible for generating the sampling rate control signal that controls the sampling rate of the A/D converter 114 included in the tuner module 114.

In the illustrated embodiment, the symbol timing recovery circuit 140 operates to synchronize the sampling of the received television signal by the A/D converter 114 at, e.g., precisely 4 times the baud rate of the received television signal and to thereby lock the sampling rate at exactly four times the incoming baud rate.

Once timing recovery is achieved, the QAM demodulator can equalize the received television signal via use of the equalizer 152. Equalization is achieved by applying the decimated QAM signals, i.e., the I and Q signals output by the decimation circuit 150, to the equalizer 152. The equalizer 152 is a digital filter having weights which are adaptable by an equalization algorithm. The equalizer 152 can be implemented using any one of a number of known equalization algorithms using either a strictly feedforward approach, e.g., using a finite impulse response ("FIR") filter or using a partially feedforward and feedback filtering approach. Both techniques are commonly in use in equalizers today.

The equalizer 152, which is an adaptive filter, receives decimated complex signals at twice the symbol rate, i.e., the I and Q signals output by the decimation circuit 150 and applies complex FIR filtering to the received signals.

In addition to the I and Q signal inputs for receiving the I and Q television signals from the decimation circuit 152, the equalizer 152 includes a complex error signal input for receiving a complex error signal used by the equalizer 152 to dynamicly adjust the filter weights of the equalizer 152. As will be discussed below, the complex error signal is produced by the slicer 156 after carrier recovery has been performed.

In the illustrated embodiment, the equalizer 152 applies complex FIR filtering to the received I and Q signals to generate I and Q output signals at twice the symbol rate.

Because the I and Q television signals output by the equalizer 152 are at twice the symbol rate, they must be decimated to the symbol rate, before carrier recovery can be performed. As will be discussed below, the QAM carrier recovery circuit 130 includes a decimation circuit 132 to perform the required decimation operation.

When viewed together, the equalizer 152 and the decimation circuit 132 operate to perform fractionally spaced equalization on the I and Q signals supplied to the equalizer circuit 152. By operating the equalizer at a rate in excess of the symbol rate it is possible to perform band edge signal distortion correction and correction outside the bandwidth of the QAM signal that would not be possible if fractionally spaced equalization were not performed. However, it should be noted that where such signal correction is not required, an equalizer operating at the symbol rate may be used instead of the fractionally spaced equalizer shown in FIG. 1. In such a case, the I and Q television signals output by the QAM filter circuit 120 are decimated to the symbol rate by the decimation circuit 150 prior to being supplied to the equalizer 152. When the equalizer 152 operates at the symbol rate the output of the equalizer 152 will also be at the symbol rate so there is no need for the QAM carrier recovery circuit 130 to decimate the I and Q signals prior to carrier recovery.

The algorithm for adaptation implemented by the adaptive equalizer 152 can be one of many techniques, with the most popular being the simple least-mean-squares ("LMS") updating algorithm. Accordingly, in one embodiment of the present invention, the adaptive equalizer 152 uses the LMS updating algorithm as the method of adaptive equalization.

The I and Q television signal outputs of the equalizer 152 are coupled to the input of the QAM carrier recovery circuit 130. As discussed above, QAM carrier recovery is performed at baseband. Because the output of the equalizer 152 is at twice the symbol rate, the decimation circuit 132 is used to reduce the symbol rate of the I and Q television signals output by equalizer 152 to the symbol rate while leaving the I and Q signals at passband.

In addition to the decimation circuit 152, the QAM carrier recovery circuit 130 includes a sin/cos lookup table which is stored in a read only memory (ROM) 136. The sin/cos values stored in the ROM 136 are supplied to a QAM carrier recovery module 135 which is also part of the QAM carrier recovery circuit 130 and to the error rotator 154.

The QAM carrier recovery module performs carrier recovery on the I and Q signals output by the decimation circuit 152 as a function of the sin/cos values stored in the ROM 136. In particular, the QAM carrier recovery module 135 converts the television signal output by the decimation circuit 132 to I and Q baseband signals by mixing the I and Q passband signals received from the decimation circuit 132 with sin and cosine waves generated using the values obtained from the table stored in the ROM 136.

Carrier recovery implemented by the QAM carrier recovery module 135 is achieved by using decision directed techniques, which is very different from carrier recovery techniques used for VSB signals. Accordingly, only some of the components of the QAM carrier recovery circuit 130 can be used for carrier recovery in a joint QAM/VSB demodulator circuit. As will be discussed further below, one major carrier recovery circuit element that can be used in both QAM and VSB carrier recovery circuits is the sin/cos lookup table implemented in the ROM 136.

The baseband I and Q television signals output by the QAM carrier recovery module 135 represent soft symbol decisions. These soft symbol decisions serve as the baseband television signal output of the QAM carrier recovery circuit 130. I and Q baseband signal outputs of the QAM carrier recovery circuit 130 are coupled to corresponding I and Q basedband signal inputs of the slicer 156. Thus, the slicer 156 is supplied with the I and Q basedband television signals output by the carrier recovery circuit 156.

The slicer 156 acts as a threshold comparitor in X and y trying to find the box, of a QAM constellation plot, into which each soft decision received from the QAM carrier recovery circuit 130 falls. The product of this comparison operation, i.e., the determinations as to which boxes of the QAM constellation plot into which the soft symbol decisions fall, are hard decisions which serve as the output of the slicer 156.

The soft decisions output by the carrier recovery circuit 130 serve as the output of the QAM demodulator 100. Normally, these soft decisions are subsequently supplied to an forward error correction ("FEC") circuit such as a trellis decoder.

In one embodiment of the QAM demodulator 100, the slicer 156 includes one slicer circuit for each of the I and Q received signals, i.e., channels, with the slicers being simple threshold comparators. The slicer 156 used in the QAM demodulator is similar to the slicer which is used in a VSB demodulator as will be discussed below.

In addition to outputting the hard symbol decisions, the slicer 156 generates a complex slice error signal that is provided to a corresponding input of the error rotator 154. The complex slice error signal is the result of each soft error decision received by the slicer 156 being subtracted from the hard error decision made by the slicer 156.

The error rotator circuit 154 receives from the ROM 136, the sin/cos values used to produce the soft symbol decisions which resulted in the error signal values received from the slicer 156. The error rotator 154 uses the sin/cos values received from the ROM 136 to rotate the error signals received from the slicer 156 into the passband domain so that they can be used to update the values used for tap weights of the passband adaptive equalizer 152 via the error signal input of the equalizer 152 as illustrated in FIG. 1.

Figure 2:
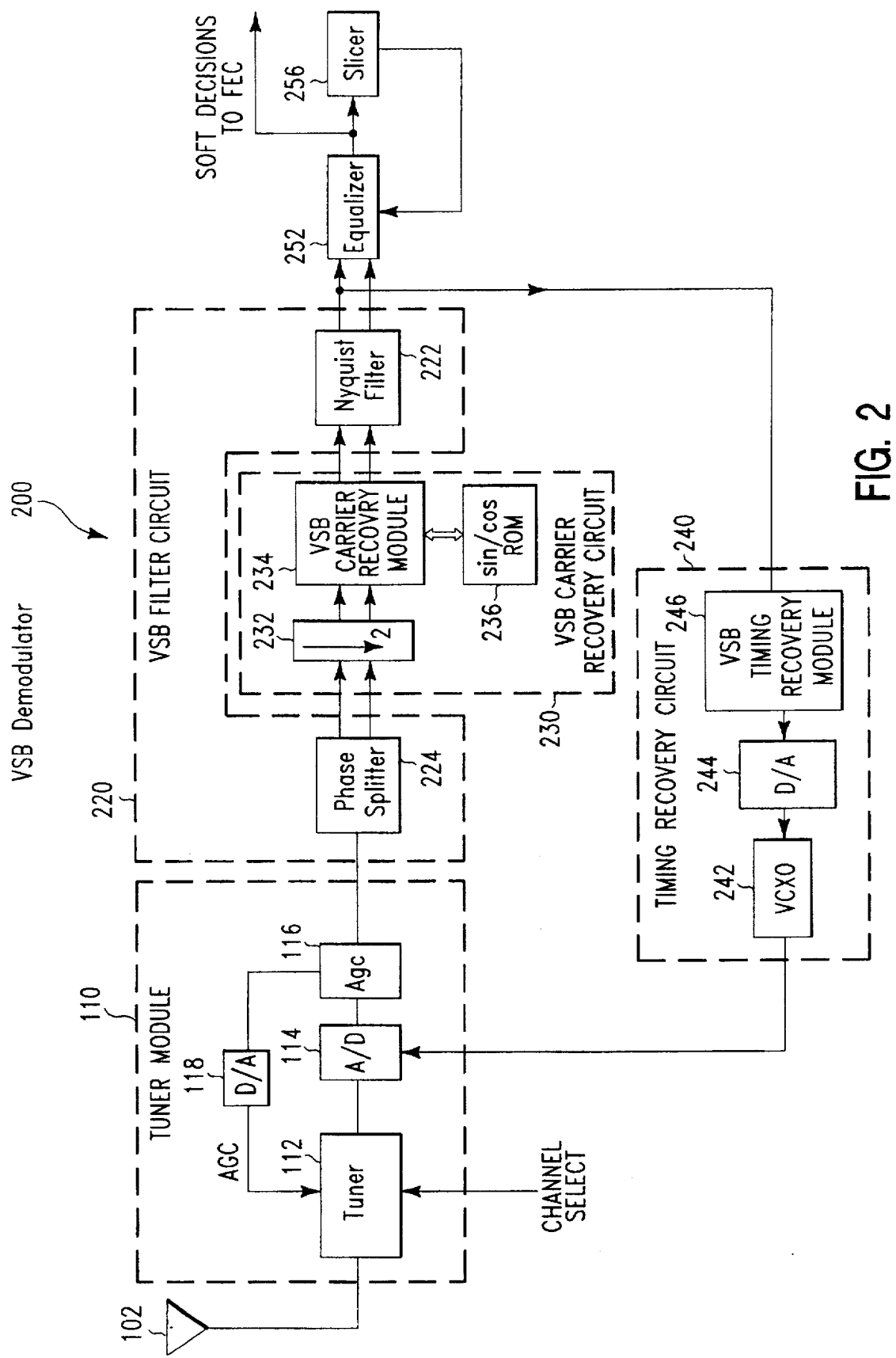
FIG. 2 is a schematic block diagram of a VSB demodulation circuit in accordance with another embodiment of the present invention.

Referring now to FIG. 2, the VSB demodulator circuit 200 of the present invention will now be described. Like numbered elements included in the QAM demodulator circuit 100 of FIG. 1 and the VSB demodulator circuit 200 of FIG. 2 are the same as or similar circuit elements and therefore will not be described again in detail.

The VSB demodulator circuit 200 illustrated in FIG. 2 comprises a tuner module 110, a VSB filter circuit 220, a VSB carrier recovery circuit 230 an equalizer 252, a slicer 256, and a timing recovery circuit 240.

As in the case of the QAM demodulator 100, the tuner 110 is used to receive cable or terrestrial broadcasted signals, e.g., via the antenna 102. The VSB demodulator 200 is designed so that signal processing is done in the digital domain with minimal requirements placed on the functionality of the tuner module 110. The tuner module 110 used in the QAM demodulator 100 can be used in the VSB demodulator 200 since the design of the VSB demodulator 200 only requires that the tuner module 110 have sufficient channel selectivity to select the appropriate channel, e.g., the channel indicated by the channel select signal.

To insure that the tuner module 110 can be used with both QAM and VSB signals, the SAW filter 111, included in the tuner circuit 112 of the tuner module 110, is designed to pass both QAM and VSB signals with a minimal amount of distortion. Since both QAM and VSB ATV signals are expected to have approximately a 6 MHz bandwidth, using a SAW filter 111 with a 6 MHz bandwidth should be sufficient to pass both QAM and VSB signals with the tuner output center frequency being the same for both QAM and VSB signals.

When being used for VSB demodulation, the output of the tuner module 112 is digitized by the A/D converter 114, using e.g., 8 bits of precision, at twice the symbol rate of the VSB signal being received. This sampling rate will correspond to approximately the same rate used to sample QAM ATV signals when the QAM signals are sampled at four times the QAM symbol rate.

The digitized VSB signal output by the A/D converter 114 is applied to the AGC circuit 116 which operates as previously described in regard to the QAM demodulator circuit 100 with the gain control signal output by the AGC circuit 116 being converted by the D/A converter 118 and applied to the gain-controlled amplifier 113 of the tuner circuit 112.

The VSB television signal output by the tuner module 110 is supplied to the input of the VSB filter circuit 220. The VSB filter circuit 220 comprises a phase splitter 224, e.g., a Hilbert transform filter, and a Nyquist filter 222. The Hilbert transform filter 224 has an input coupled to the output of the tuner module 110 to receive therefrom the VSB signal. The Hilbert transform filter 224 creates a complex analytic signal, i.e., I and Q signals, which are then output to the VSB carrier recovery circuit 230 which has an input coupled to the output of the Hilbert transform filter 224.

The Hilbert transform filter 224 filters the received VSB signal to form a one sided complex signal such that complex bandshifitng can be achieved without foldover distortion occurring to the VSB signal when it is subsequently shifted down to baseband. The Hilbert transform filter 224 is a short complex filter that takes real samples in and supplies complex samples out. In one embodiment, the filter is a fixed weight finite impulse response ("FIR") filter that can be designed using CSD coefficients to minimize the amount of hardware required to implement the filter 224 and to thereby minimize implementation costs.

For purposes of implementing a joint VSB/QAM demodulator, it is significant to note that except for different filter weights, the Hilbert transform filter 224 has the same structure as that of the complex Nyquist filter 122 used to implement the QAM demodulator 100.

The VSB carrier recovery circuit 230 which receives the I and Q signals output by the Hilbert transform filter 224 includes a decimation circuit 232, a VSB carrier recovery module 234, and a ROM 236 for storing a sin/cos lookup table.

The decimation circuit 232 receives the I and Q signals output by the Hilbert transform filter 224 and down samples these signals by a factor of two to generate I and Q signals at the symbol rate upon which carrier recovery can then be performed.

I and Q signal outputs of the decimation circuit 232 are coupled to corresponding inputs of the VSB carrier recovery module 234. The VSB carrier recovery module 234 is also coupled to the ROM 236 so that it can receive therefrom sin/cos values stored in the lookup table contained in the ROM 236.

In VSB, a pilot tone is transmitted with the modulated data stream. This pilot tone is used for carrier recovery, and as will be discussed further below, may also be detected and used to distinguish VSB signals from QAM signals which, as a general rule, do not include pilot tones.

The VSB carrier recovery module 234 differs significantly from the QAM carrier recovery module 135 because the use of a pilot tone for carrier recovery makes the technique used for VSB carrier recovery significantly different than that used for QAM carrier recovery.

The VSB carrier recovery module 234 extracts the pilot tone using a narrow bandpass filter, e.g., a bandpass filter sufficiently narrow to extract the pilot tone from the received signal, and then applies the extracted pilot tone to a phase locked loop circuit to generate a coherent recovered carrier signal. The recovered carrier information is then mixed with the complex signal received from the Hilbert transform filter 224 to place the complex signal at baseband. To generate a band shifting complex sinusoid used in the mixing operation to shift the complete signal received from the Hilbert transform filter 224 to baseband, the SIN/COS lookup table stored in the ROM 236 is used.

Figure 3A:
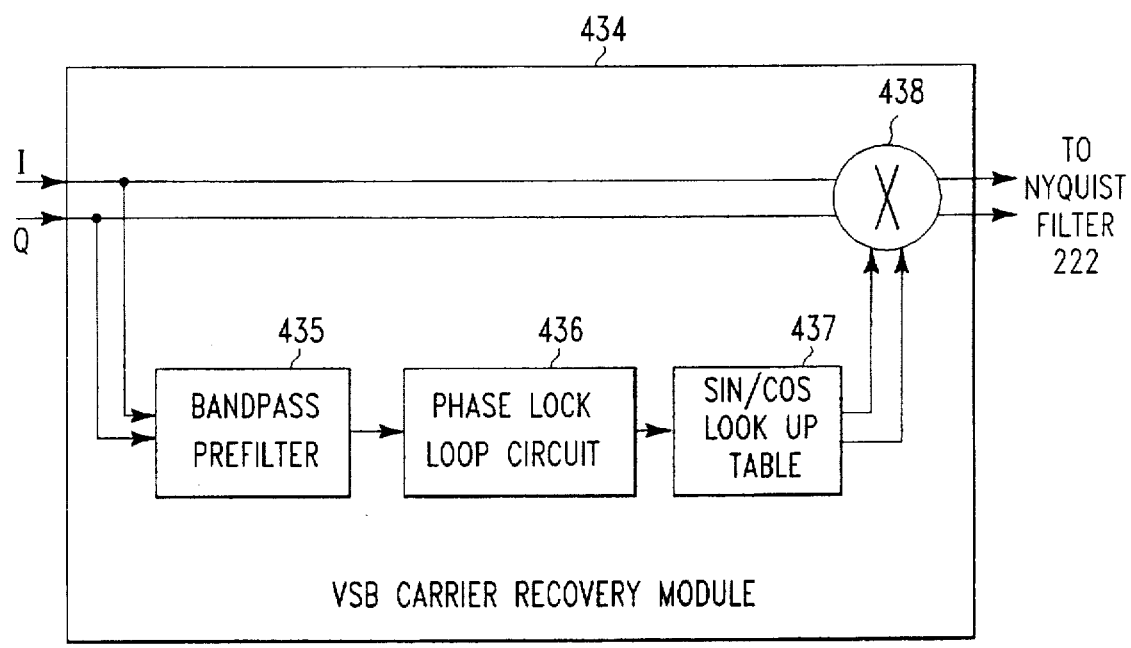
FIG. 3A is a schematic block diagram of a VSB carrier recovery module suitable for use as the VSB carrier recovery module of the VSB demodulator illustrated in FIG. 2.

Referring now briefly to FIG. 3A, there is illustrated a VSB carrier recovery module 434 in accordance with one embodiment of the present invention that can be used as the VSB carrier recovery module 234 of the VSB demodulator 200.

The VSB carrier recovery circuit 343 comprises a bandpass filter 435, a phase lock loop circuit 436, a sin/cos lookup table 437 and a complex mixer 438. The bandpass filter 435 receives the complex signal output by the Hilbert transformer 224 and extracts the pilot tone therefrom. The extracted pilot tone is supplied to the input of the phase locked loop circuit 436 which generates a coherent recovered carrier signal from the extracted pilot tone. The recovered carrier information is then supplied to the sin/cos lookup table 437 which is used to generate a complex sinusoid which is a function of the recovered carrier information. The complex sinusoid generated using the lookup table 437 is then mixed with the complex signal received from the Hilbert transform filter 224, by the complex mixer 438, to place the complex signal at baseband. The complex baseband signal generated by the complex mixer 438 serves as the output of the VSB carrier recovery module 434. It should be noted that the sin/cos lookup table stored in the ROM 236 of the demodulator 200 may be used as the sin/cos lookup table 437.

While the VSB carrier recovery module will, in most embodiments, mix the received complex passband signal down to baseband it is possible to implement the VSB carrier recovery module so that it mixes the passband signal to a frequency other than baseband to allow for the potential simplification of other circuits included within a receiver incorporating the demodulator 200 according to the present invention.

Because a SIN/COS lookup table of the same type as used in the VSB demodulator 200 is also used in the QAM demodulator circuit 100 a single ROM may be used to store a SIN/COS lookup table to be used in a joint QAM/VSB demodulator circuit as will be discussed further below.

The VSB carrier recovery circuit 230 outputs the complex baseband signal, comprising I and Q signals, generated by the VSB carrier recovery circuit 234 and supplies the complex baseband signals to corresponding inputs of the Nyquist filter 222. Thus, once the VSB signal has been shifted to baseband, the signal is applied to the Nyquist filter 222 which is designed to match the VSB signals excess modulation bandwidth. In one embodiment, the Nyquist filter 222 is a fixed weight filter that can be designed using CSD coefficients.

The Nyquist filter 222 has the same structure as that of the Nyquist filter 122 used in the QAM demodulator 100. Since the excess bandwidth of the QAM and VSB signals may be different, different weights may be required for each of the filters 122, 222.

If a single filter is to be used in a joint QAM/VSB demodulator in place of the filters 122, 222 the required difference in filter weights can be achieved by multiplexing filter coefficients. In such an embodiment, in the QAM mode, CSD coefficients are used to form the portion of the Nyquist filter used during VSB mode. In VSB mode, the portion of the Nyquist filter formed using CSD coefficients will serve as the entire Nyquist filter. The different filter coefficients that are used during QAM and VSB modes of operation may be very close in value and hence one can use the same tap weight values for both QAM and VSB modes of operation. When a Nyquist filter is implemented in such a manner, for use in a joint QAM/VSB demodulator, the need for a multiplexer to switch between filter different coefficient values for each of the QAM and VSB modes of operation is avoided. However, such an embodiment has the disadvantage of resulting in small mismatches in the Nyquist filter design. However, it should be noted that such small mismatches in the desired Nyquist filter weights can be compensated for to some extent by the use of the adaptive equalizer 152, 252 which processes the QAM or VSB signal subsequent to the filtering operation.

The complex output of the Nyquist filter 222, i.e., the I and Q signals, are supplied to the input of the equalizer 252 which has its inputs coupled to the outputs of the Nyquist filter 222. In addition, the I (real) signal output of the Nyquist filter 222, which contains the data in a VSB transmission, is coupled to the input of the symbol timing recovery circuit 240.

In FIG. 2, it can be seen that the timing recovery circuit 240 includes a VSB timing recovery module 246, a D/A converter 244 and a VCXO 242. The symbol timing recovery technique used in VSB is likely to be driven by repeating patterns embedded in the symbol stream output by the Nyquist filter 222. Accordingly, the VSB timing recovery module 246 uses the repeating patterns embedded in the I signal received from the Nyquist filter to perform symbol timing recovery.

Figure 3B:
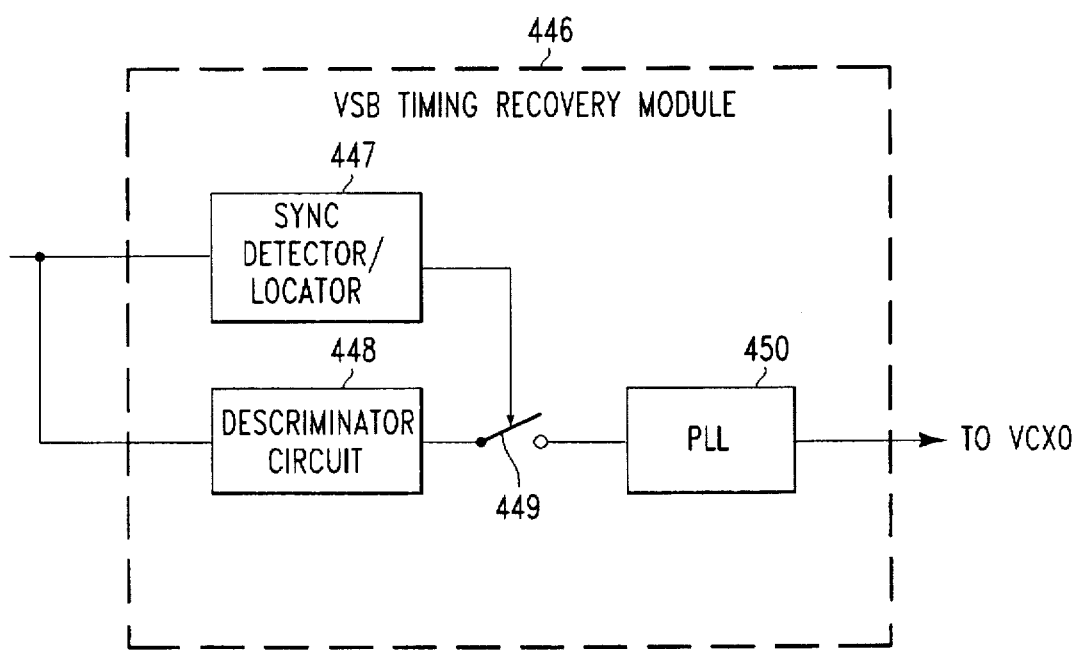
FIG. 3B is a schematic block diagram of a VSB timing recovery module suitable for use as the VSB timing recovery module of the VSB demodulator illustrated in FIG. 2.

Referring now briefly to FIG. 3B there is illustrated a VSB timing recovery module 446 that can be used as the timing recovery module 246. The VSB timing recovery module 446 comprises a sync detector/locator circuit 447, a discriminator circuit 448, a switch 449 and a phase lock loop circuit 450.

The VSB timing recovery module 446 receives the real passband signal output by the filter circuit 220 and supplies this signal to the input of both the sync detector/locator circuit 447 and the discriminator circuit 448. The sync selector/locator circuit 447 detects the timing sync signals included in the passband VSB signal and asserts a signal which is used to close the switch 449 when a sync signal is detected in the received signal. The switch 449, which is closed by the sync detector only when the sync signal is detected couples the output of the discriminator circuit 448 to the input of the phase lock loop circuit 450. Thus, the phase lock loop circuit which generates the symbol timing signal output by the VSB timing recovery module 446 is a function of both the output of the discriminator 448 and the sync selector/locator circuit 447 which determines when the output of the discriminator is supplied to the input of the phase lock loop circuit 450.

The VSB symbol timing signal output of the VSB timing recovery module is coupled to an input of the D/A converter 244 which converts the digital VSB symbol timing signal into an analog signal before supplying it to the VCXO 242. The analog VSB symbol timing signal is used to drive the VCXO 242 which is tuned to twice the VSB symbol rate. The output of the VCXO 242 is coupled to the sampling rate control signal input of the tuner's A/D converter 114. Accordingly, the sampling rate control signal generated by the VCXO 242, in response to the VSB symbol timing control signal, controls the tuner's A/D converter 114 to sample the received VSB signal at twice the VSB signal's symbol rate.

The symbol timing recovery circuit 240, and the VSB timing recovery module 246 in particular, are noticeably different from the symbol timing recovery circuit 140 used for QAM symbol timing recovery because of the differences in recovery techniques and sampling rates used for each of the two types of signals. Hence, when implementing a joint QAM/VSB tuner only some components of the timing recovery circuits, such as the D/A converter 144, 244 can be shared. Furthermore, unless the symbol rates for QAM and VSB are simply related, e.g., one being a multiple of the other, it is likely that two independent crystals will be needed to drive such a joint demodulator during each of the distinct QAM and VSB modes of operation.

Referring once again to the VSB demodulator 200 illustrated in FIG. 2, it can be seen that the complex output of the Nyquist filter 222 is coupled to a corresponding complex input of the adaptive equalizer 252 which operates at baseband.

As in the case of the QAM demodulator 100, a number of techniques can be used for updating the filter tap weights of the adaptive equalizer 252. Functionally updating an adaptive equalizer operating at baseband is the same as updating the equalizer 152 which operates in the QAM passband. The difference between the update procedure is that QAM requires the use of a complex equalizer and a rotated error signal, where VSB can use a complex or a real equalizer without error rotation. In both the VSB and QAM modulation formats, a feed-forward FIR based equalizer, which is relatively simple to implement, can be used. However, in VSB, a training sequence within the symbol stream allows for more powerful equalization techniques and structures than are used in QAM.

In accordance with the present invention, when implementing a VSB and/or a joint QAM/VSB demodulator, to support powerful VSB equalization and yet retain an essentially identical equalizer structure for use during both QAM and VSB demodulation, a short feed-forward FIR section equalizer is used followed by a longer decision-feedback equalizer ("DFE") structure. To accomplish this, all that is necessary is to re-direct equalizer signal paths depending on the signal mode in which a joint QAM/VSB demodulator is operating so that during QAM mode only the feed-forward portion of the equalizer 252 will be used while during VSB mode both the feed-forward DFE structure of the equalizer 252 will be used.

Figure 3C:
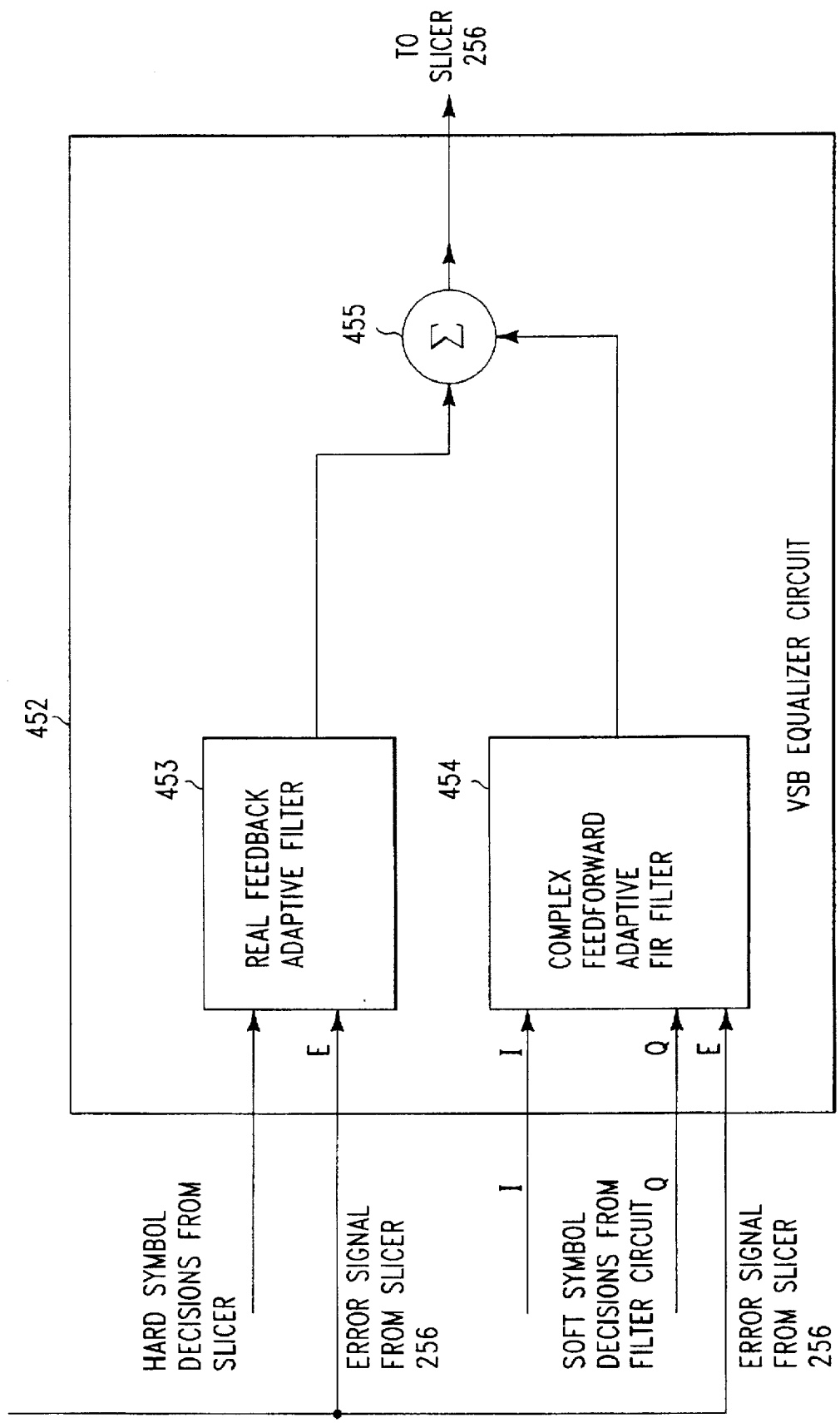
FIG. 3C is a schematic block diagram of a VSB equalizer circuit suitable for use as the equalizer circuit of the VSB demodulator illustrated in FIG. 2.

Referring now briefly to FIG. 3C, there is illustrated a feedforward/feedback type equalizer 452 which may be used as the complex equalizer 252 of the VSB demodulator 200. As illustrated, the equalizer 452 comprises a real feedback adaptive filter 453, a complex feedforward adaptive FIR filter 454 and a summer 455 for summing the outputs of the two filters 452, 453 to generate the signal output by the equalizer 452. As illustrated both filters 452, 453 receive the error signal supplied by the slicer 256 that is used to update the equalizer tap weights. However, the complex feedforward FIR filter 454 receives as its inputs the complex signal output by the filter circuit 320 while the real feedback filter 453 receives as its input a feedback signal obtained form the output of the slicer 256.

It should be noted that a feedforward/feedback type equalizer may also be used when demodulating QAM signals.

Whether the equalizer 252 is implemented as either a feed-forward FIR based equalizer or a feedforward/feedback type equalizer, the equalizer 252 can be used to support either QAM or VSB demodulation by simply multiplexing the equalizer outputs to form a complex or all real filter and to make the equalizer only a feedforward equalizer or an equalizer with decision feedforward/feedback equalization.

For example, the VSB equalizer circuit 452 may be converted into a purely feedforward equalizer by simply using a switch to disconnect the output of the real feedback filter 453 from the input of the summer 455 when operating in QAM mode.

Referring once again to FIG. 2, the output of the equalizer 252 is coupled to the input of the symbol slicer 256. The structure of the slicer 256 is the same as that of the slicer 156 used in the QAM demodulator 100 but with different slice thresholds being used for VSB demodulation as compared to QAM demodulation. The slicer 256 generates a slicer error signal which is output via a corresponding slice error signal output of the slicer 256. The slice error signal output is coupled a corresponding error signal input of the adaptive equalizer 252. In this manner, the slice error signal received from the slicer 256 is used for decision directed updating of the equalizer 252. Since, in the VSB demodulator 200, the equalizer 252 operates at baseband, no rotation of the slice error signal is required as it is in th QAM demodulator 100.

Now that both the QAM and VSB demodulators 100, 200 of the present invention have been explained, a joint QAM/VSB demodulator circuit according to the present invention 300, illustrated in FIG. 4 will be explained.

Figure 4:
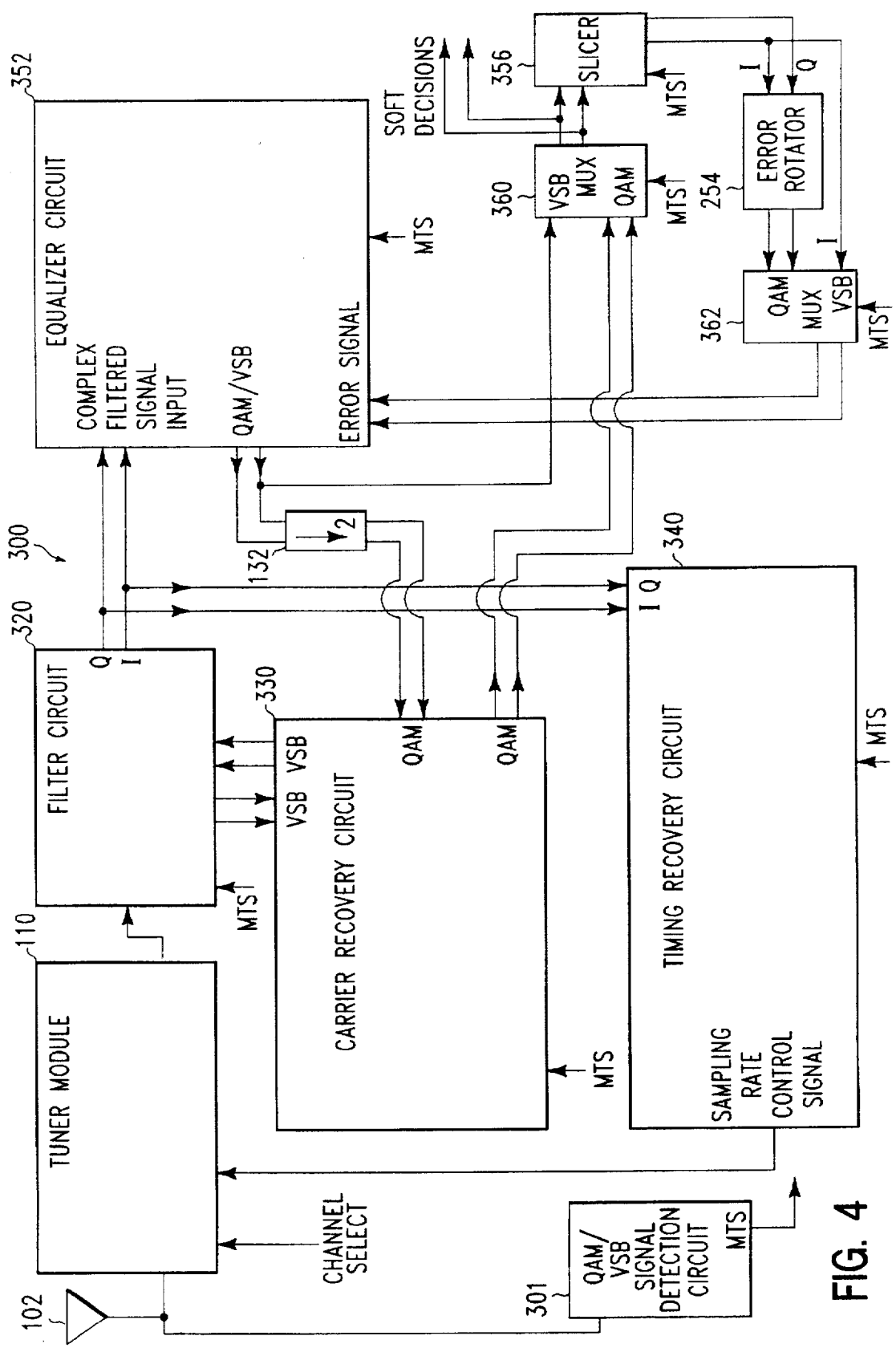
FIG. 4 is a schematic block diagram illustrating a joint QAM/VSB demodulator capable of demodulating either QAM or VSB signals implemented in accordance with the present invention.
Figure 5A:
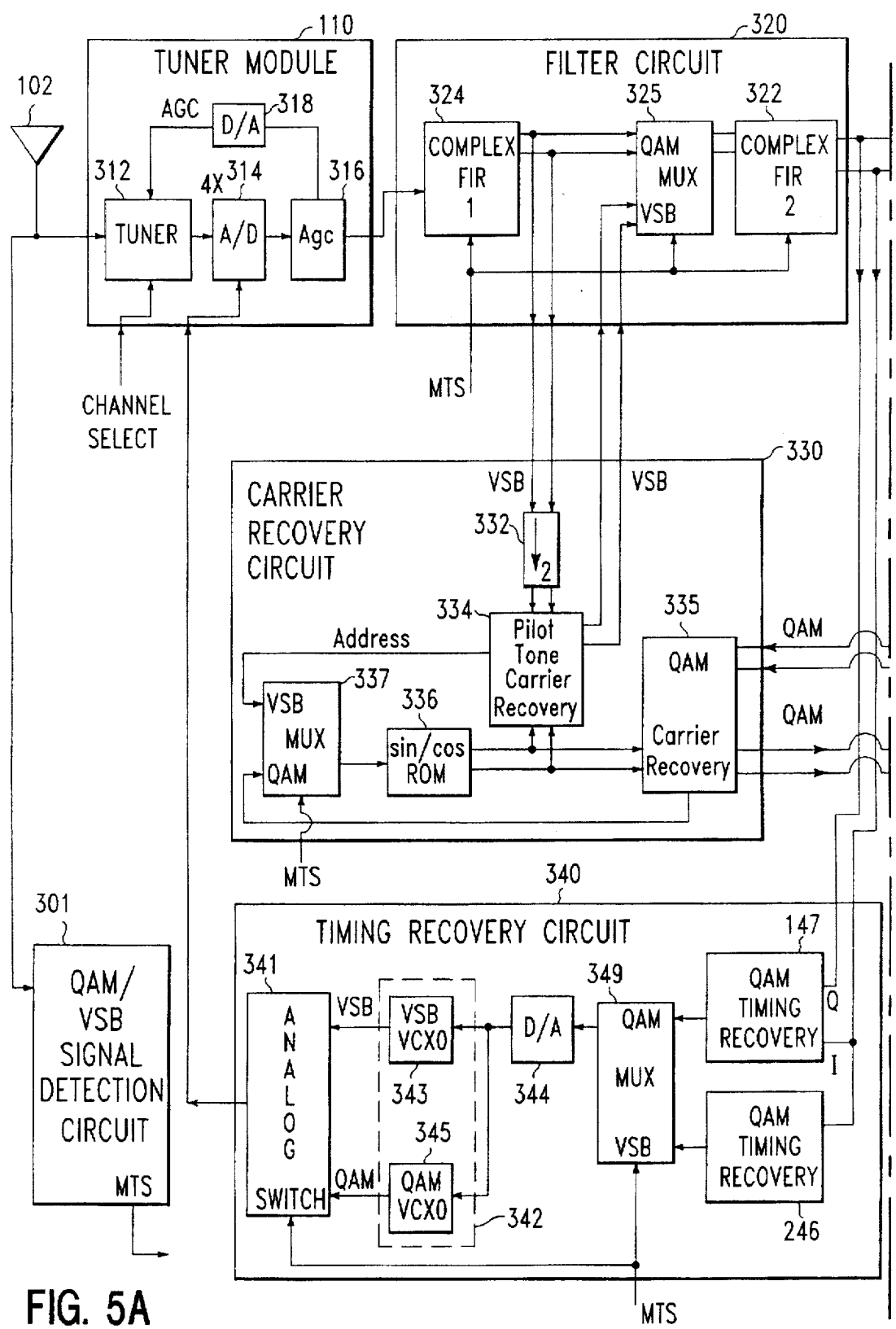
FIG. 5 is a more detailed schematic block diagram of the joint QAM/VSB demodulator circuit illustrated in FIG. 4.

Elements bearing the same reference numerals used to identify elements in FIGS. 1 and 2, are the same as or similar to the like numbered elements in FIGS. 4 and 5.

Referring now to FIG. 4, it can be seen that the joint QAM/VSB demodulator 300 according to the present invention includes a tuner module 110, a filter circuit 320, an equalizer circuit 352, a carrier recovery circuit 330, a timing recovery circuit 340, a decimation circuit 132, a first MUX 360, a second MUX 362, a slicer, an error rotator 354, and a QAM/VSB signal detection circuit 301.

The QAM/VSB signal detection circuit is coupled to the television signal source, i.e., the antenna 102, in the embodiment illustrated in FIG. 4 to receive therefrom the same television signal supplied to the tuner module 110 which operates as previously described in regard to the QAM and VSB demodulator circuits illustrated in FIGS. 1 and 2. The QAM/VSB signal detection circuit monitors the received signal for a pilot tone which is included in a VSB signal for carrier recovery purposes but is absent from a QAM signal. If the QAM/VSB detection circuit detects the pilot tone in the received television signal it asserts a modulation type selection ("MTS") signal indicating that the demodulator 300 is receiving a VSB signal and should therefore operate in VSB mode. When no pilot tone is detected, the MTS signal is de-asserted indicating that the demodulator 300 is receiving a QAM signal and should operate in QAM mode.

While the MTS signal is shown as being directly supplied to the various components of the demodulator 300 to control their configuration, it is possible to supply the MTS signal to a microprocessor which would be responsible for controlling adjustments to filter weights and the various MUXes used to control the signal path through the demodulator 300. Through the use of such a control circuit, centralized control and updating of filter weights throughout the demodulator may be achieved simplifying the hardware needed to implement individual filter circuits.

An MTS output of the QAM/VSB signal detection circuit 301 is coupled to corresponding inputs of the filter circuit 320, carrier recovery circuit 330, equalizer circuit 352, timing recovery circuit 340, slicer 356 and first and second multiplexers 360, 362. In this manner, each of these circuit elements receives the MTS signal which is used to switch each of the circuits from QAM mode to VSB mode whenever a VSB signal is detected.

By multiplexing signal paths of the QAM and VSB demodulators 100, 200 as shown in FIGS. 4 and 5, it is possible to combine the two demodulators 100, 200 into a single joint demodulator 300 with a minimal amount of additional hardware required to implement the joint QAM/VSB demodulator 300 over the hardware required to implement either the individual QAM or VSB demodulators 100, 200.

Each of the circuit elements of the joint QAM/VSB demodulator 300 are designed to correspond to elements of the demodulators 100, 200 in such a manner that permits each of the elements of the demodulators 100, 200 to be implemented in the joint demodulator 300 with a minimum amount of circuit duplication. For example, the tuner module 110 corresponds directly to the tuner module 110 of the demodulators 100, 200. The filter circuit 320 corresponds to the QAM and VSB filter circuits 120, 220, the equalizer circuit 352 corresponds to the equalizer circuits 152, 252, the timing recovery circuit 340 corresponds to the QAM and VSB timing recovery circuits 140, 240, the carrier recovery circuit 330 corresponds to the QAM and VSB carrier recovery circuits 130, 230 while the slicer 356 corresponds to the slicers 156, 256 used in each of the QAM and VSB demodulator circuits 100, 200.

Referring now to FIG. 5, the joint QAM/VSB demodulator circuit 300 is illustrated in greater detail. As illustrated the tuner module 110 receives the signal to be demodulated as previously described with regard to FIGS. 1 and 2, converts it to a digital signal by sampling it at the rate determined by the sampling rate control signal output by the timing recovery circuit 340 and adjusts the gain of the received signal. The digital signal output by the tuner module 110 is supplied to the input of the filter circuit 320.

The filter circuit 320 includes a first complex FIR filter 324, a multiplexer ("MUX") 325 and a second complex FIR filter 322 each of which have MTS signal inputs coupled to the MTS signal output of the QAM/VSB signal detection circuit 301.

The first complex FIR filter 324 has an input coupled to the output of the tuner module 110 for receiving therefrom the received television signal which, in the case of VSB, will be at 2 times the VSB symbol rate and in the case of QAM 4 times the QAM symbol rate.

A complex output of the first complex FIR filter 324 is coupled to a complex VSB signal input of the carrier recovery circuit 330 and to a QAM input of the MUX 325. A VSB signal input of the MUX 325 is coupled to a complex VSB signal output of the carrier recovery circuit 330. In this manner, the MUX 325 receives the complex signal from the first complex FIR filter 324 and the complex VSB signal output by the carrier recovery circuit 330. When the MTS signal is asserted, indicating that a VSB signal is being processed, the MUX 325 supplies the complex VSB signal, received from the carrier recovery circuit 330, to the second complex FIR filter 322. However, when the MTS signal is de-asserted indicating that demodulator 300 is receiving a QAM signal, the MUX 325 supplies the complex signal output by the first complex filter 324 to the second complex filter 322 for further processing.

The configuration of the first and second complex FIR filters 324, 322 are controlled by the MTS signal. In the VSB mode, i.e., when the MTS signal is asserted, the first complex FIR filter 324 is set up to be a Hilbert transform filter, which operates the same as filter 224 described in regard to FIG. 2. In the QAM mode, e.g., when the MTS signal is de-asserted, the first complex FIR filter 324 is configured such that the weights of the first complex FIR filter 324 correspond to the first N weights of a complex Nyquist filter formed by the series combination of the first and second complex FIR filters 324, 322. In one embodiment, the length N is selected to equal the length of the VSB Hilbert transform filter used for VSB demodulation. The configuration change between the first N taps of the Nyquist filter and the Hilbert transform filter configuration is achieved by multiplexing new CSD coefficients in the first complex FIR filter 324 in response to the MTS signal.

During VSB mode, the second complex filter serves as the Nyquist filter, e.g. the filter 222 of FIG. 2, for a VSB demodulator receiving as its input the complex VSB carrier recovery signal Output by the carrier recovery circuit 330 and supplied to the second complex FIR filter circuit 322 via the MUX 325.

In QAM mode, the second complex Fir filter 322 receives the signal directly output from the first complex FIR filter 324 via the MUX 325 and, in such a case, serves as the remaining section of the QAM Nyquist filter, e.g., the Nyquist filter 122 of FIG. 1.

As in the case of the first complex FIR filter 324, the second complex FIR filter 322 is reconfigured for each of the modulation types in response to the MTS signal by multiplexing CSD coefficients.

As illustrated in FIG. 5, the carrier recovery circuit 330 comprises a decimation circuit 332, a pilot tone carrier recovery circuit 334, a QAM carrier recovery circuit 335, a MUX 337 and a ROM 336 for storing a sin/cos lookup table.

In VSB mode, the carrier recovery circuit 330 receives the complex signal output of the first complex FIR filter 324 as an input signal which is decimated by the decimation circuit 322. The output of the decimation circuit 332 is supplied to an input to the pilot tone carrier recovery circuit 334 which corresponds to the VSB carrier recovery module 234 illustrated in FIG. 2. During VSB mode an output of the pilot tone carrier recovery circuit 334 supplied to the ROM 336, via the MUX 337, is used to control the output of the sin/cos lookup table stored in the ROM 336. The pilot tone carrier recovery circuit 334 receives the sin/cos values output by the ROM 336 and uses these values to perform a VSB carrier recovery operation on the complex signal received from the first complex FIR filter 324 via the decimation circuit 332. In this manner, during VSB mode, the carrier recovery circuit 330 operates in a manner similar to the VSB carrier recovery circuit 230 illustrated in FIG. 2. During VSB mode operation, the output of the pilot tone carrier recovery circuit 334 serves as the input to the second complex FIR filter 322.

The complex output of the second complex FIR filter 322 of the filter circuit 320 is coupled to a complex input to the equalizer circuit 352 and the symbol timing recovery circuit 340.

The symbol timing recovery circuit 340 includes a QAM symbol timing recovery module 147, a VSB timing recovery module 246, a MUX 349, a D/A converter 344, a VCXO circuit 342 and an analog switch 341.

The MTS signal which is supplied to a control input of the MUX 349 and the analog switch 341 controls the symbol timing recovery circuit 340 to operate in either QAM mode or VSB mode.

As illustrated in FIG. 5, the QAM timing recovery module 147 is coupled to both the I and Q signal terminals of the filter circuit's complex signal output while the VSB timing recovery module 246 receives only the I (real) signal output by the filter circuit 320.

The outputs of the QAM and VSB timing recovery modules 147, 246 are coupled to corresponding input of the MUX 349. When the demodulator 300 is operating in VSB mode, as indicated by the MTS signal being asserted, the MUX 349 couples the output of the VSB timing recovery module to the input of the D/A converter. However, when operating in VSB mode, the MUX 349 couples the output of the VSB timing recovery circuit 246 to the input of the D/A converter 344. Accordingly, during VSB mode, the D/A converter 344 receives a VSB timing recovery signal which is converted into an analog signal and supplied to the VCXO circuit 342. However, during QAM mode, the D/A converter will receive a QAM timing recovery signal output by the QAM timing recovery module 147 via the MUX 349.

The analog output of the D/A converter 344 is supplied to both a VSB VCXO 343 and a QAM VCXO 345 that comprise the VCXO circuit 342. The outputs of both the VSB and QAM VCXOs 343, 345 are coupled to corresponding inputs of the analog switch 341 which determines, as a function of the MTS signal, which sampling rate control signal received by the analog switch 341 will be supplied to the sampling rate control signal input of the tuner module's A/D converter 314 at any given time. Accordingly, during VSB mode, the analog switch 341 couples the output of the VSB VCXO 343 to the tuner modules A/D converter 114 but couples the output of the QAM VCXO 345 to the A/D converter 114 during QAM mode. In this manner, the timing recovery circuit functions as the VSB symbol timing recovery circuit 240 during VSB mode operation and as the QAM symbol timing recovery circuit 140 during QAM mode operation.

As discussed above, the complex output of the filter circuit 320, and the second complex FIR filter 322 in particular, is coupled to a complex input of the equalizer circuit 352.

The equalizer circuit 352 comprises a decimation circuit 353, a MUX 355, an adaptive equalizer circuit 352, a modulation configuration controller 359 and an update algorithm training sequence control circuit 357.

The complex signal received from the filter circuit 320 is supplied to the input of the decimation circuit 353 which, in turn, has an output coupled to a QAM input of the MUX 355. In addition, the complex signal received from the filter circuit 320 is supplied directly into a VSB input of the MUX 355. In this manner, the MUX receives the decimated filter circuit output as a QAM input signal and the filter circuit's full rate output as the VSB signal input.

The MUX 355 is responsive to the MTS signal to couple the VSB signal input to the equalizer 351 when the MTS signal is asserted and to couple the QAM signal input to the equalizer 351 at other times. As discussed with regard to the VSB equalizer embodiment, the equalizer 351 may be implemented as a purely feedforward FIR filter. Alternatively, it may include a feedback equalization circuit that is used in conjunction with the feedforward FIR filter during VSB mode operation. The modulation configuration controller 359 which receives the MTS signal as an input is responsible for controlling the configuration of the equalizer 351 and for configuring it as a feedback circuit during VSB mode. The fact that the equalizer 351 is performing equalization at passband during QAM mode and baseband during VSB mode is unimportant since the structure of the equalizer 351 is the same for both operations. The required filtering speed for the equalizer 351 in QAM mode is twice the QAM symbol rate and approximately equal to the VSB symbol rate when operating in VSB mode. Since the VSB symbol rate is approximately the same as twice the QAM symbol rate, the equalizer 351 can be used to handle both modes of operation.

As discussed above, the configuration of the equalizer 351 during either the QAM or VSB modes of operation is controlled by the modulation configuration controller 359 which redirects signal paths within the equalizer 351 to make the equalizer all feedforward or partially feedforward and partially feedback in response to the MTS signal during VSB mode.

The complex output of the equalizer 351 is coupled via the decimation circuit 132 to the QAM input of the carrier recovery circuit 330 which performs QAM carrier recovery at baseband.

During QAM mode operation, the carrier recovery circuit 330 operates in a manner similar to the QAM carrier recovery circuit 130 illustrated in FIG. 1. In particular, the QAM carrier recovery module 335 receives the decimated output of the equalizer circuit 352 and performs carrier recovery using sin/cos values obtained from the ROM 336. During QAM mode operation, the MUX 337 couples the QAM carrier recovery sin/cos lookup signal output to the sin/cos table stored in the ROM 336 to insure that the appropriate sin/cos values are provided to the QAM carrier recovery circuit 335.

The complex output of the QAM carrier recovery module 335, representing the complex QAM carrier recovery signal, is coupled to a QAM input of the MUX 360 which is used to control the input to the slicer 356. A VSB signal input of the MUX 360 is coupled to the I (real) signal output of the equalizer 351 which is part of the complex signal output of the equalizer circuit 352.

The MUX 360 is responsive to the MTS signal to supply the undecimated I signal output by the equalizer circuit 352 during VSB mode operation, and the complex QAM carrier recovery signal output by the carrier recovery circuit 330 during QAM mode operation, to the input of the slicer 356. As discussed above, the slicer 356 is configured to use different threshold values for making symbol decisions during VSB and QAM modes of operation with the particular set of values being used being selected as a function of the MTS signal.

The complex error signal generated by the slicer 356 during QAM mode operation is supplied to the input of the error rotator 254 which is also coupled to the ROM 336 for receiving therefrom sin/cos values used to rotate the received basedband error signal into the passband.

The output of the error rotator 254, which represents a complex error signal to be used to update the equalizer circuit 352 during QAM mode operation, is coupled to a QAM input of the MUX 362 which also has a VSB signal input coupled directly to the I signal portion of the slicer's complex error signal output.

During VSB mode, the MUX 362 serves to supply the real baseband VSB error signal to the update algorithm training sequence circuit 357 of the equalizer circuit 352. However, the complex passband error signal output by the error rotator 254 is supplied by the MUX 362 to the update algorithm training sequence circuit 357 during QAM mode. Accordingly, the update algorithm training sequence circuit 357 receives the appropriate error signal information during each mode of operation and operates to update the tap values of the equalizer 351 as required by the received error signals.

Thus, from the above description, it is apparent that the joint QAM/VSB demodulator 300 illustrated in FIG. 3, is capable of providing both QAM and VSB signal demodulation capability with a minimum of additional circuitry over the circuitry required to implement either a single VSB or QAM signal demodulator 100, 200. Thus, the design of the present invention has the advantage of a low requirement for additional hardware over a single demodulator 100, 200, perhaps in the order of ten percent.

While the demodulators 200, 300 for demodulating VSB signals have been described in terms of embodiments where the input to the VSB symbol timing recovery modules 246 are supplied from the real portion of the nyquist filter output, it should be noted that the equalizer output may serve as the source of the signal supplied to the VSB timing recovery module 246.

Figure 6:
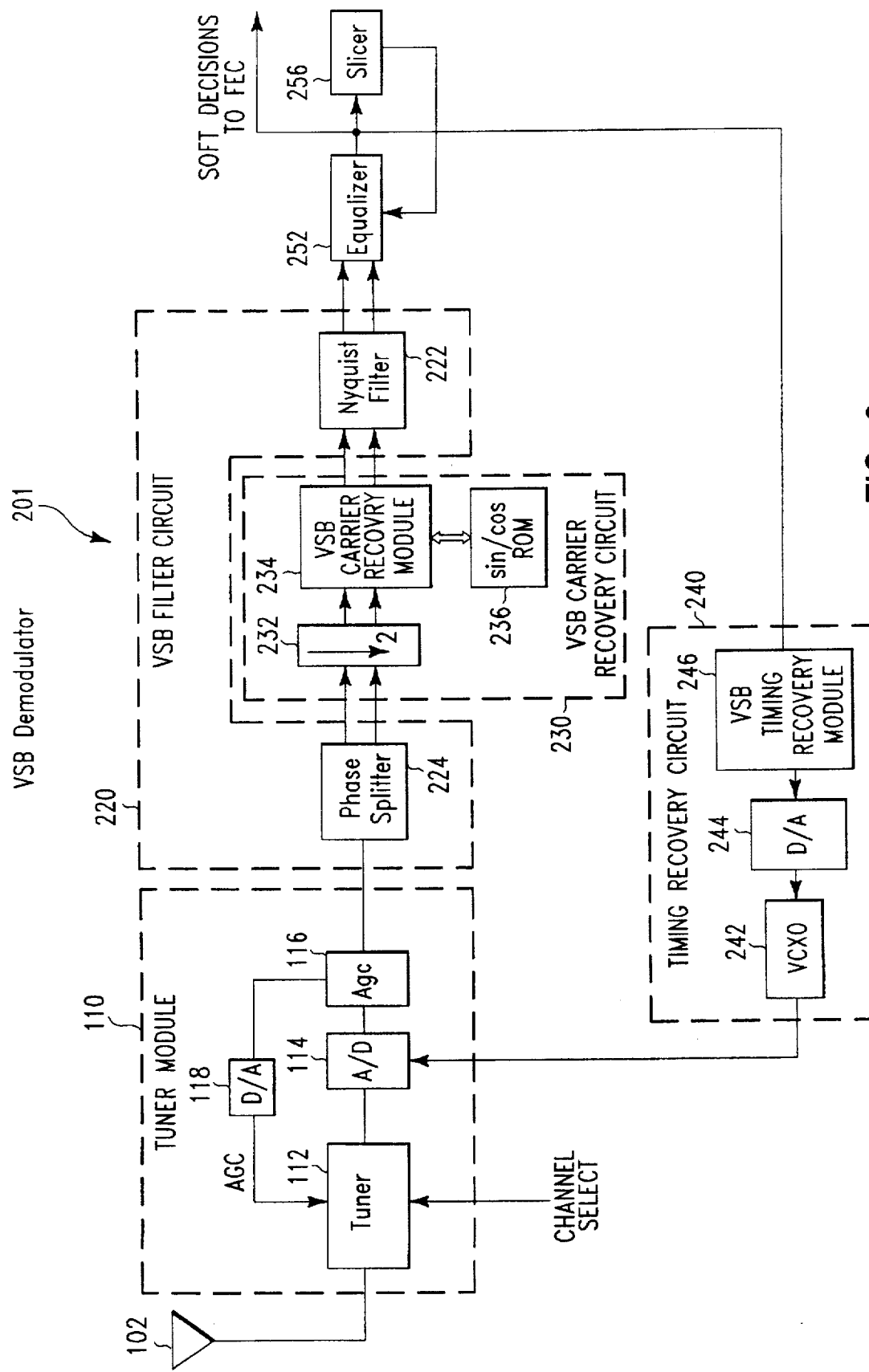
FIG. 6 is a schematic block diagram of a VSB demodulator according to the present invention that uses the output of the equalizer as the input to the demodulator's symbol timing recovery circuit.

Referring now to FIG. 6, there is illustrated a VSB demodulator circuit 201 implemented in accordance with one embodiment of the present invention. The VSB demodulator 201 while similar to the previously described VSB demodulator 200, uses the output of the equalizer 252 as the input to the timing recovery circuit 240 and thus the VSB timing recovery module 246.

Figure 7:
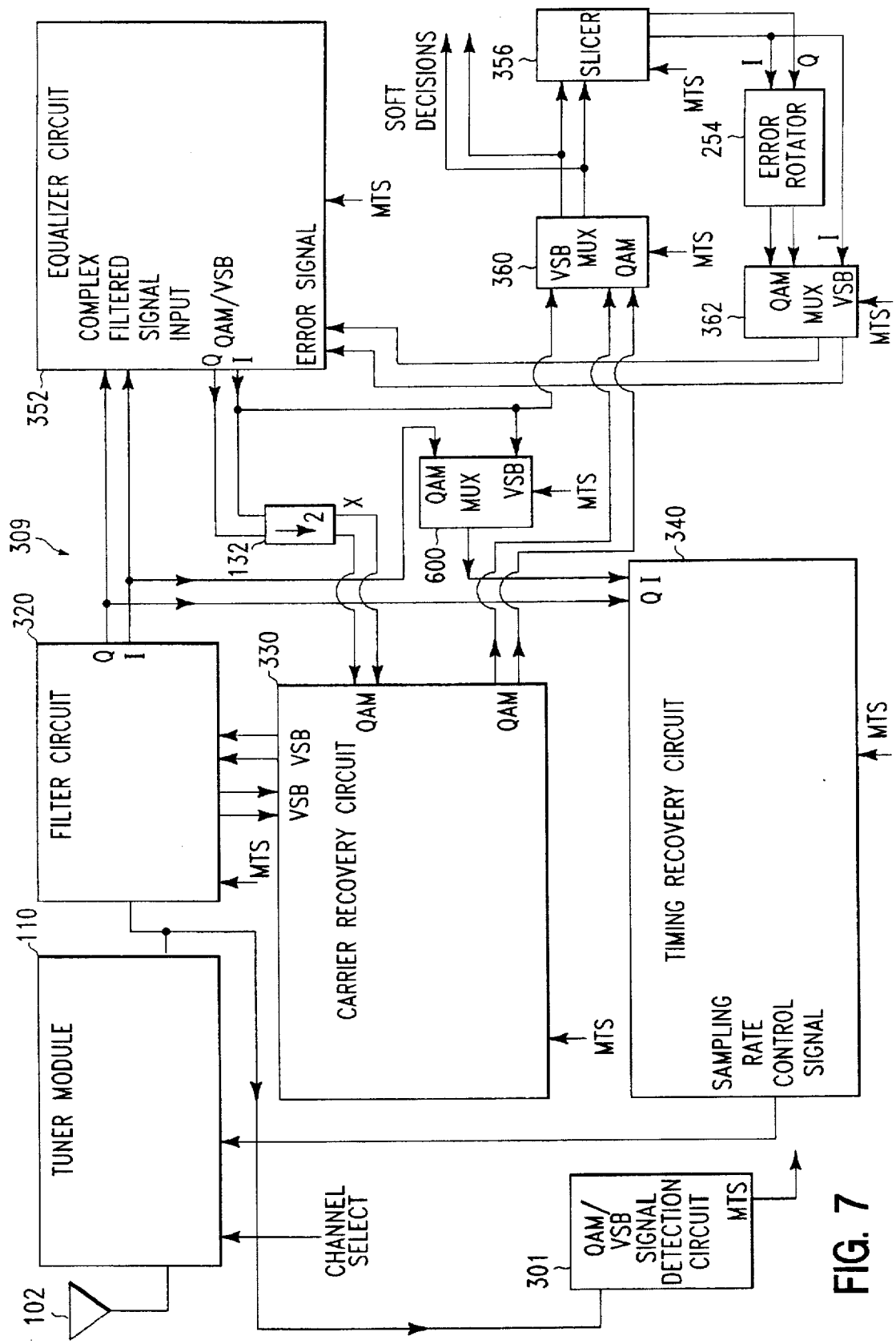
FIG. 7 is a schematic block diagram of a joint QAM/VSB demodulator according to the present invention that uses the output of the demodulator's equalizer as the input to the demodulator's symbol timing recovery circuit during VSB demodulation.

Referring now to FIG. 7, there is illustrated a joint QAM/VSB demodulator 309, which is similar to the demodulator 300, but includes an additional MUX 600 for supplying the output of the equalizer to the input of the timing recovery circuit 340 during VSB mode.

Accordingly, as illustrated in FIGS. 6 and 7 it is possible to use the output of the equalizer for symbol timing recovery purposes when performing VSB demodulation.

It should be noted that the QAM/VSB signal detection circuit 301, of the joint QAM/VSB demodulators, need not receive the VSB or QAM signal directly from the signal source, e.g., the antenna, but may receive the signal from another point within the demodulator 300, 309, e.g., from the output of the tuner as illustrated in FIG. 7.

What is claimed is:

1. An apparatus for use in a VSB demodulator circuit, comprising:

a surface acoustic wave filter for filtering an analog input signal to isolate an analog VSB signal;

an analog to digital converter coupled to the surface acoustic wave filter for converting the analog VSB signal into a digital VSB signal;

a fully digital VSB carrier recovery circuit coupled to the analog to digital converter for performing a digital carrier recovery operation, including a decimation operation, on the digital VSB signal to generate a baseband VSB signal therefrom; and a complex digital Nyquist filter coupled to the output of the VSB carrier recovery circuit.

2. The apparatus of claim 1, further comprising:

an equalizer coupled to the complex digital Nyquist filter.

3. An apparatus for use in a VSB demodulator circuit, comprising:

a filter for filtering an input signal which includes a VSB signal to isolate the VSB signal;

a phase splitter coupled to the filter, the phase splitter filtering the isolated VSB signal to generate a complex digital VSB signal;

digital VSB carrier recovery means coupled to the output of the phase splitter for performing a digital VSB carrier recovery operation which includes a decimation operation on the complex digital VSB signal; and a complex digital Nyquist filter coupled to the digital VSB carrier recovery means for performing a complex Nyquist filtering operation subsequent to the decimation operation performed by the digital VSB carrier recovery means.

4. An apparatus for use in a VSB demodulator circuit, comprising:

a tuner module having an input adapted for receiving an analog signal including an analog VSB signal and an output, the tuner module including:

i. a surface acoustic wave filter for filtering the analog input signal to generate an analog VSB signal; and ii. an analog to digital converter coupled to the surface acoustic wave filter and to the output of the tuner, the analog to digital converter converting the analog VSB signal generated by the surface acoustic wave filter into a digital VSB signal;

a phase splitter coupled to the tuner for filtering the digital VSB signal to generate a complex digital VSB signal therefrom; and digital VSB carrier recovery means coupled to the phase splitter for performing a digital VSB carrier recovery operation on the complex digital VSB signal to generate a baseband VSB signal therefrom the digital VSB carrier recover means including:

i. a decimation circuit coupled to the phase splitter for decimating the complex digital VSB signal output by the phase splitter;

ii. a sin/cos lookup table containing a plurality of sin/cos values for generating complex sinusoidal waveforms; and iii. a complex mixer coupled to the decimation circuit and the sin/cos lookup table for mixing the decimated complex digital VSB signal and a complex sinusoidal signal generated from the sin/cos values in the lookup table, the mixing operation generating the complex baseband VSB signal.

5. The apparatus of claim 4, further comprising:

a digital Nyquist filter having an input coupled to the VSB carrier recovery means and a complex output including a real output channel and a quadrature output channel, the Nyquist filter performing pulse shaping of the complex baseband VSB signal output by the VSB carrier recovery means to generate a complex filtered baseband VSB signal.

6. The apparatus of claim 4, further comprising:

digital symbol timing recovery means coupled to the complex mixer and to a sampling rate control signal input of the analog to digital converter for controlling the sampling rate of the analog to digital converter as a function of a real signal component of the complex filtered baseband VSB signal.

7. The apparatus of claim 5, further comprising:

digital symbol timing recovery means coupled to the real output channel of the Nyquist filter and to a sampling rate control signal input of the analog to digital converter for controlling the sampling rate of the analog to digital converter as a function of a real signal component of the complex filtered baseband VSB signal.

8. The apparatus of claim 7, further comprising:

an adaptive equalizer coupled to the complex output of the Nyquist filter for generating and outputting a real equalizer output signal representing a series of soft symbol decisions; and a signal type detection circuit coupled to the output of the analog to digital converter for detecting the presence of a VSB pilot tone.

9. An apparatus for use in a demodulator circuit, comprising:

a tuner module having an input adapted for receiving an analog signal including an analog signal of interest, wherein the analog signal of interest is one of a VSB and a QAM analog signal, the tuner module including:

i. a tuner filter circuit for isolating and outputting the analog signal of interest; and ii. an analog to digital converter coupled to the tuner filter circuit, the analog to digital converter converting the analog signal of interest output by the tuner filter circuit into a digital signal;

a signal type detection circuit coupled to the output of the tuner for detecting the presence of a VSB signal and for asserting a modulation type selection signal to indicate the receipt of a VSB signal;

a demodulator filter circuit including:

a first complex finite impulse response filter coupled to the output of the tuner and to the signal type detection circuit, the first complex finite impulse response filter being response to the assertion of the modulation type selection signal by the signal type detection circuit to operate as a phase splitter and to the de-assertion of the modulation type selection signal to operate as the first N taps of a Nyquist filter;

a MUX having a QAM input coupled to an output of the first complex finite impulse response filter, a control input coupled to the signal type detection circuit and an output, the MUX operating to couple the QAM input to the output when the modulation type selection signal is deasserted;

a second complex finite impulse response filter coupled to the output of the MUX and to the signal type detection circuit, the second complex finite impulse response filter being response to the assertion of the modulation type selection signal to operate as an M tap Nyquist filter and to the de-assertion of the modulation type selection signal to operate as the last M taps of a Nyquist filter having a total of M+N taps, where M and N are integers, to produce a complex filtered signal.

10. The apparatus of claim 9, wherein the MUX has a VSB signal input and is responsive to the assertion of the modulation type selection signal to couple the VSB signal input of the MUX to the MUX output, the apparatus further comprising:

a carrier recovery circuit having a VSB signal input coupled to the output of the first complex finite impulse response filter, a modulation type selection signal input coupled to the signal type detection circuit and a VSB signal output coupled to the VSB signal input of the MUX, the carrier recovery circuit operating to perform a passband carrier recovery operation on the signal output by the first complex finite impulse response filter in response to the assertion of the modulation type selection signal to produce a baseband VSB signal.

11. The apparatus according to claim 9, further comprising:

adaptive equalizer means coupled to the second complex finite impulse response filter and to the QAM/VSB signal detection circuit for processing the complex signal received from the second finite impulse response filter to generate an equalizer output signal, the equalizer means including:

means for configuring the adaptive equalizer means as a feedforward/feedback type equalizer in response to the assertion of the modulation type selection signal and for configuring the adaptive equalizer as a purely feedforward finite impulse response filter as a function of the modulation type selection signal being de-asserted.

12. The apparatus of claim 11, wherein the adaptive equalizer means includes means for decimating the complex signal output by the second finite impulse response filter when the modulation type selection signal is de-asserted.

13. A demodulator comprising:

a demodulator filter circuit for filtering a modulated signal as a function of a modulation type selection signal, the demodulator filter circuit including:

a first complex finite impulse response filter adapted for receiving the modulated signal, the first complex finite impulse response filter being response to a first state of the modulation type selection signal to operate as a phase splitter and to a second state of the modulation type selection signal to operate as the first N taps of a Nyquist filter, where N is an integer.

14. A demodulator comprising:

a demodulator filter circuit for filtering a modulated signal as a function of a modulation type selection signal, the demodulator filter circuit including:

a first complex finite impulse response filter adapted for receiving the modulated signal, the first complex finite impulse response filter being response to a first state of the modulation type selection signal to operate as a phase splitter and to a second state of the modulation type selection signal to operate as the first N taps of a Nyquist filter, where N is an integer;

a MUX including a QAM input coupled to an output of the first complex finite impulse response filter and a MUX output, the MUX operating to couple the QAM input and the MUX output when the modulation type selection signal is in the second state; and a second complex finite impulse response filter coupled to the MUX output, the second complex finite impulse response filter being response to the first state of the modulation type selection signal to operate as an M tap Nyquist filter and to the second state of the modulation type selection signal to operate as the last M taps of a Nyquist filter having a total of M+N taps, where M and N are integers.

15. The demodulator of claim 14, further comprising:

a carrier recovery circuit having a VSB signal input coupled to the output of the first complex finite impulse response filter and a VSB signal output coupled to the VSB signal input of the MUX, the carrier recovery circuit operating to perform a passband carrier recovery operation on the signal output by the first complex finite impulse response filter in response to the assertion of the modulation type selection signal to produce a VSB baseband signal; and wherein the MUX further includes a VSB signal input and is responsive to the first state of the modulation type selection signal to couple the VSB signal input of the MUX to the MUX output.

16. The demodulator of claim 15, further comprising:

equalizer circuit means coupled to an output of the second complex finite impulse response filter, the equalizer circuit means including means for decimating the output of the second complex finite impulse response filter in response to the second state of the modulation type selection signal.

17. An adaptive equalizer update circuit for generating one of a complex and real equalizer update signal for use in updating an adaptive equalizer operating in either a QAM mode of operation or a VSB mode of operation, the particular mode of operation at any given time being indicated by the state of a modulation type signal, a first state of the modulation type signal indicating the VSB mode of operation and a second state of the modulation selection type signal indicating the QAM mode of operation, the adaptive equalizer update circuit comprising:

a first multiplexer having a first input adapted for receiving a complex signal representing QAM soft symbol decisions, a second input adapted for receiving a real signal representing VSB soft symbol decisions, a control input for receiving the modulation type signal, and an output, the first multiplexer outputting the received complex signal when the modulation type signal is in the second state and outputting the real signal when the modulation type signal is in the first state;

a complex slicer having a complex signal input coupled to the output of the MUX, and a modulation type signal input, the complex slicer using a first set of decision thresholds to generate the complex equalizer update signal when the modulation type signal is in the second state and using a second set of decision thresholds to generate the real equalizer update signal when the modulation type signal is in the first state.

18. The adaptive equalizer update circuit of claim 17, further comprising:

an error rotator circuit coupled to the slicer for rotating the complex equalizer update signal from QAM baseband to QAM passband; and a second multiplexer having a first input coupled to the error rotator, a second input coupled to the slicer, and a modulation type signal input, the second multiplexer outputting the complex equalizer update signal rotated to the QAM passband when the modulation type signal is in a second state and outputting the real equalizer update signal generated by the slicer when the modulation type signal is in the first state.

19. A method of demodulating a vestigial sideband signal comprising the steps of:

sampling the vestigial sideband signal to generate a digital passband signal;

passing the digital passband signal through a phase splitter;

performing a digital carrier recovery operation, including a decimation operation, on the signal generated by passing the passband signal through the phase splitter; and performing a complex digital Nyquist filtering operation on the signal generated by the digital carrier recovery operation.

20. The method of claim 19, further comprising the step of:

performing an equalization operation on the baseband VSB signal.

21. A method of generating an adaptive equalizer update signal in response to a modulation type selection signal, comprising the steps of:

providing a complex slicer;

when the modulation type selection signal is in a first state,
  i) supplying, to the complex slicer, a complex signal representing soft symbol decisions; and
  ii) operating the complex slicer using a first set of decision thresholds to generate a complex equalizer update signal; and when the modulation type selection signal is in a second state,
  i) supplying, to the complex slicer, a real signal representing real soft symbol decisions; and
  ii) operating the complex slicer using a second set of decision thresholds to generate a real equalizer update signal.

22. The method of claim 21, wherein the complex signal representing complex soft symbol decisions represents QAM soft symbol decisions and the real signal representing real soft symbol decisions represents VSB soft symbol decisions.

* * * * *